(12) United States Patent
Swoish

(10) Patent No.: US 10,244,621 B2
(45) Date of Patent: Mar. 26, 2019

(54) FLEX CIRCUIT SYSTEM FOR A BATTERY ASSEMBLY OF AN ELECTRIFIED VEHICLE

(71) Applicant: Ford Global Technologies, LLC, Dearborn, MI (US)

(72) Inventor: James Lawrence Swoish, Northville, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 795 days.

(21) Appl. No.: 14/011,883

(22) Filed: Aug. 28, 2013

(65) Prior Publication Data
US 2015/0064516 A1 Mar. 5, 2015

(51) Int. Cl.
| | | |
|---|---|---|
| H05K 1/02 | (2006.01) | |
| H01M 2/20 | (2006.01) | |
| H02G 5/02 | (2006.01) | |
| H01M 10/48 | (2006.01) | |
| H05K 1/18 | (2006.01) | |

(52) U.S. Cl.
CPC ............ H05K 1/028 (2013.01); H01M 2/206 (2013.01); H01M 10/482 (2013.01); H02G 5/025 (2013.01); H05K 1/0262 (2013.01); H01M 2200/103 (2013.01); H05K 1/0257 (2013.01); H05K 1/0268 (2013.01); H05K 1/0293 (2013.01); H05K 1/189 (2013.01); H05K 2201/05 (2013.01); H05K 2201/09063 (2013.01); H05K 2201/09727 (2013.01); H05K 2201/10037 (2013.01); H05K 2201/10272 (2013.01); H05K 2203/175 (2013.01); Y10T 29/49108 (2015.01)

(58) Field of Classification Search
CPC .... H02G 5/025; H01M 10/482; H01M 2/206; H05K 1/0262; H05K 1/028
USPC .......................................................... 174/254
See application file for complete search history.

(56) References Cited

U.S. PATENT DOCUMENTS

| | | | |
|---|---|---|---|
| 5,011,417 A | 4/1991 | Matsumoto et al. | |
| 7,189,929 B2* | 3/2007 | Benson | H05K 1/028 174/254 |
| 7,198,524 B2 | 4/2007 | Tsugane et al. | |
| 2008/0180208 A1* | 7/2008 | Siebens | H01H 85/303 337/241 |
| 2011/0151315 A1* | 6/2011 | Masson | H01M 2/1077 429/159 |
| 2012/0019061 A1* | 1/2012 | Nishihara | H01M 2/1077 307/10.1 |
| 2012/0164509 A1 | 6/2012 | Ogasawara et al. | |
| 2012/0196170 A1 | 8/2012 | Ijaz et al. | |
| 2012/0212232 A1 | 8/2012 | Ikeda et al. | |
| 2013/0252052 A1* | 9/2013 | Dawley | G01R 31/3696 429/93 |
| 2013/0323974 A1* | 12/2013 | Gutierrez | H01F 5/003 439/620.15 |

* cited by examiner

Primary Examiner — Tremesha S Willis
(74) Attorney, Agent, or Firm — Carlson, Gaskey & Olds

(57) ABSTRACT

A flex circuit system according to an exemplary aspect of the present disclosure includes, among other things, a substrate, at least one bus bar mounted to the substrate and at least one voltage sense lead integrated with the substrate.

19 Claims, 4 Drawing Sheets

FLEX CIRCUIT SYSTEM FOR A BATTERY ASSEMBLY OF AN ELECTRIFIED VEHICLE

TECHNICAL FIELD

This disclosure relates to a battery circuit, and more particularly, but not exclusively, to a flex circuit system for a battery assembly of an electrified vehicle.

BACKGROUND

Hybrid electric vehicles (HEV's), plug-in hybrid electric vehicles (PHEV's), battery electric vehicles (BEV's) and other known electrified vehicles differ from conventional motor vehicles in that they employ one or more electric machines (i.e., electric motors and/or generators) in addition or as an alternative to an internal combustion engine to drive the vehicle. Electrified vehicles require a power source capable of outputting high voltage current for powering such electric machines. The high voltage current is typically supplied by one or more battery assemblies that store electrical power that can be used to supply power to the electric machines.

Battery assemblies include battery cells that are configured into a series or series parallel string in order to obtain the voltage and power levels required by a drive system of an electrified vehicle. The battery cells must be reliably connected to one another in order to achieve the necessary voltage and power levels. Separate bus bars, individual sense wires that measure the voltage of each battery cell, plastic moldings, metal stampings, wire crimps, grommet moldings, and the like are commonly used to sufficiently connect the battery cells.

SUMMARY

A flex circuit system according to an exemplary aspect of the present disclosure includes, among other things, a substrate, at least one bus bar mounted to the substrate and at least one voltage sense lead integrated with the substrate.

In a further non-limiting embodiment of the foregoing system, the substrate is made of a pliable material.

In a further non-limiting embodiment of either of the foregoing systems, the pliable material includes a polyimide.

In a further non-limiting embodiment of any of the foregoing systems, an adhesive is disposed between the at least one bus bar and the substrate.

In a further non-limiting embodiment of any of the foregoing systems, the at least one voltage sense lead is printed onto an outer surface of the substrate.

In a further non-limiting embodiment of any of the foregoing systems, the at least one voltage sense lead is sandwiched between at least two dielectric layers of the substrate.

In a further non-limiting embodiment of any of the foregoing systems, the at least one voltage sense lead extends between the bus bar and a connector that is configured to connect to a control module.

In a further non-limiting embodiment of any of the foregoing systems, a fuse link is formed in the at least one voltage sense lead.

In a further non-limiting embodiment of any of the foregoing systems, an opening through the substrate is configured to access the fuse link.

In a further non-limiting embodiment of any of the foregoing systems, the fuse link is a narrowed portion of a copper trace of the at least one voltage sense lead, the fuse link configured to sever in response to a high current event.

A battery assembly according to an exemplary aspect of the present disclosure includes, among other things, a plurality of battery cells. A flex circuit system electrically connects the plurality of battery cells, the flex circuit system comprising a pliable substrate, a plurality of bus bars mounted to the pliable substrate, and voltage sense leads electrically connected to at least one of the plurality of bus bars.

In a further non-limiting embodiment of the foregoing battery assembly, a terminal of each of the plurality of battery cells is connected to at least one of the plurality of bus bars.

In a further non-limiting embodiment of either of the foregoing battery assemblies, the pliable substrate includes a relief area configured to receive the terminal for contacting the at least one of the plurality of bus bars.

In a further non-limiting embodiment of any of the foregoing battery assemblies, the voltage sense leads are integrated with the pliable substrate.

In a further non-limiting embodiment of any of the foregoing battery assemblies, the voltage sense leads extend between the plurality of bus bars and a connector that connects to a control module of the flex circuit system.

A method according to another exemplary aspect of the present disclosure includes, among other things, assembling a flex circuit system for a battery assembly of an electrified vehicle, including providing a substrate, mounting a bus bar to the substrate and integrating a voltage sense lead with the substrate.

In a further non-limiting embodiment of the foregoing method, the substrate includes making the substrate from a pliable material.

In a further non-limiting embodiment of either of the foregoing methods, the mounting includes attaching the bus bar to the substrate with an adhesive and arranging the bus bar relative to the substrate with automated vision equipment.

In a further non-limiting embodiment of any of the foregoing methods, the integrating includes applying the voltage sense lead onto a surface of the substrate.

In a further non-limiting embodiment of any of the foregoing methods, the integrating includes sandwiching the voltage sense lead between at least two dielectric layers of the substrate.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

The various features and advantages of this disclosure will become apparent to those skilled in the art from the following detailed description. The drawings that accompany the detailed description can be briefly described as follows.

DETAILED DESCRIPTION

This disclosure relates to a flex circuit system for a battery assembly of an electrified vehicle. The flex circuit system described by this disclosure can utilize one or more of integrated bus bars, voltage sense leads and fuses fabricated directly into a flex circuit substrate in order to electrically connect a plurality of battery cells of a battery assembly. Among other features, the exemplary flex circuit system provides a simplified and easily implementable design that increases overall safety and robustness of the circuit while eliminating the need for separate fuse components on individual sense wires and incorporating this functionality at the energy source.

Figure 1:
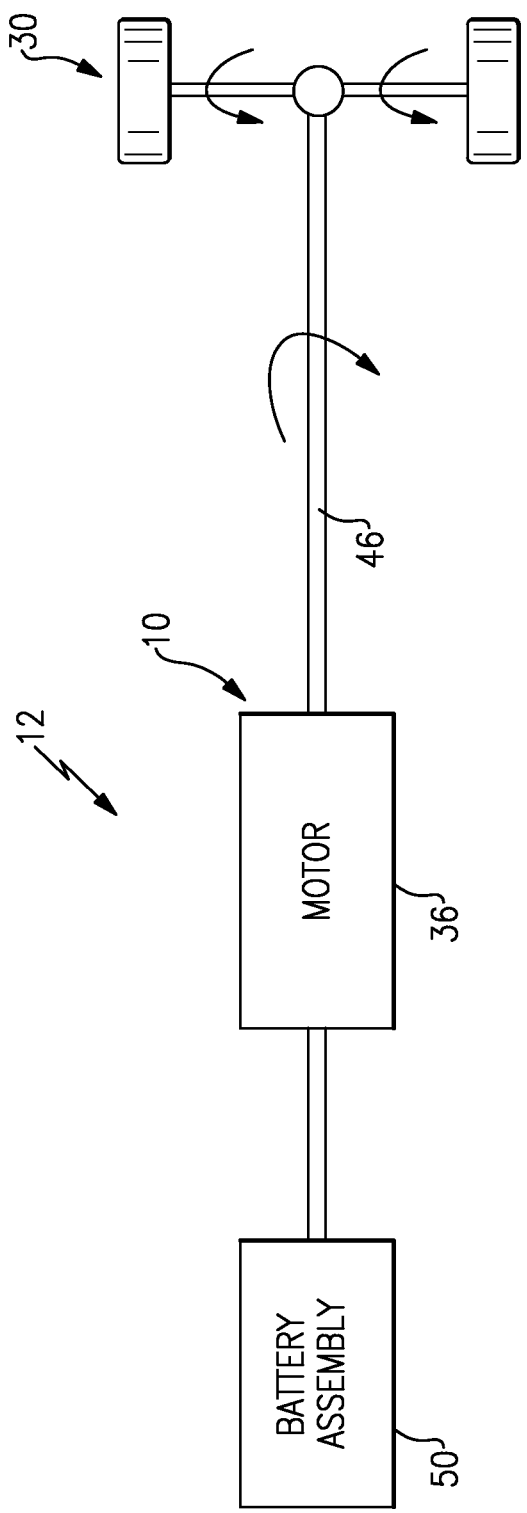
FIG. 1 schematically illustrates a powertrain of an electrified vehicle.

FIG. 1 schematically illustrates a powertrain 10 for an electrified vehicle 12. The electrified vehicle 12 may be a HEV, PHEV or BEV, or any other vehicle. In one embodiment, the powertrain 10 includes a drive system having at least a motor 36 and a battery assembly 50. The drive system generates torque to drive one or more sets of vehicle drive wheels 30 of the electrified vehicle 12. For example, the motor 36 can be employed to drive the vehicle drive wheels 30 by outputting torque to a shaft 46. The battery assembly 50 may be a high voltage battery that is capable of outputting electrical power to operate the motor 36. Of course, this view is highly schematic and it should be appreciated that other components, such as an internal combustion engine, a generator and/or a power transfer unit, could be incorporated as part of the electrified vehicle 12.

Figure 2:
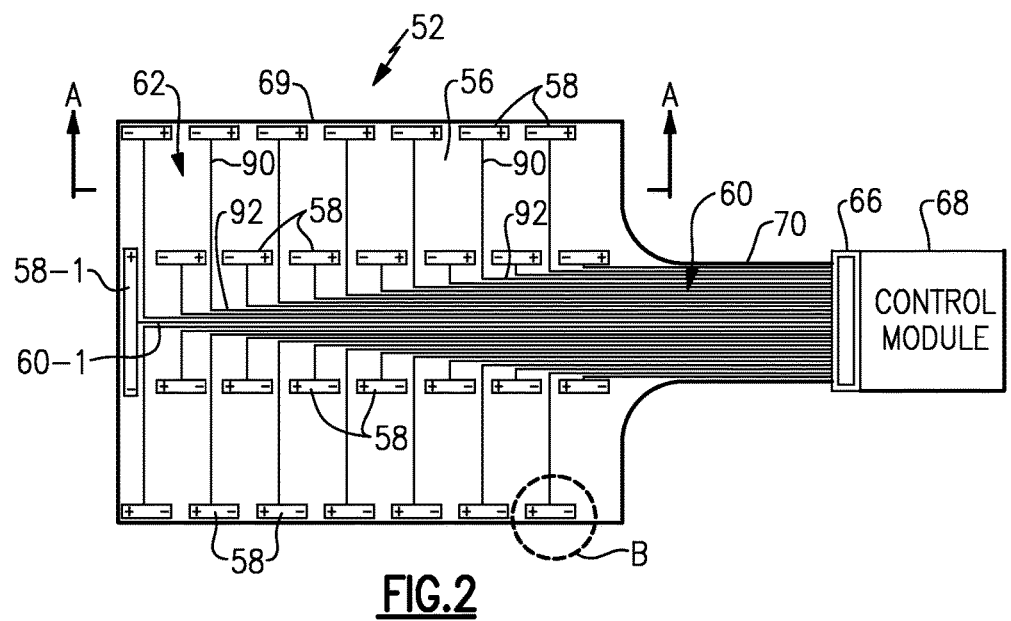
FIG. 2 illustrates a flex circuit system that can be incorporated into a battery assembly of an electrified vehicle.
Figure 3:
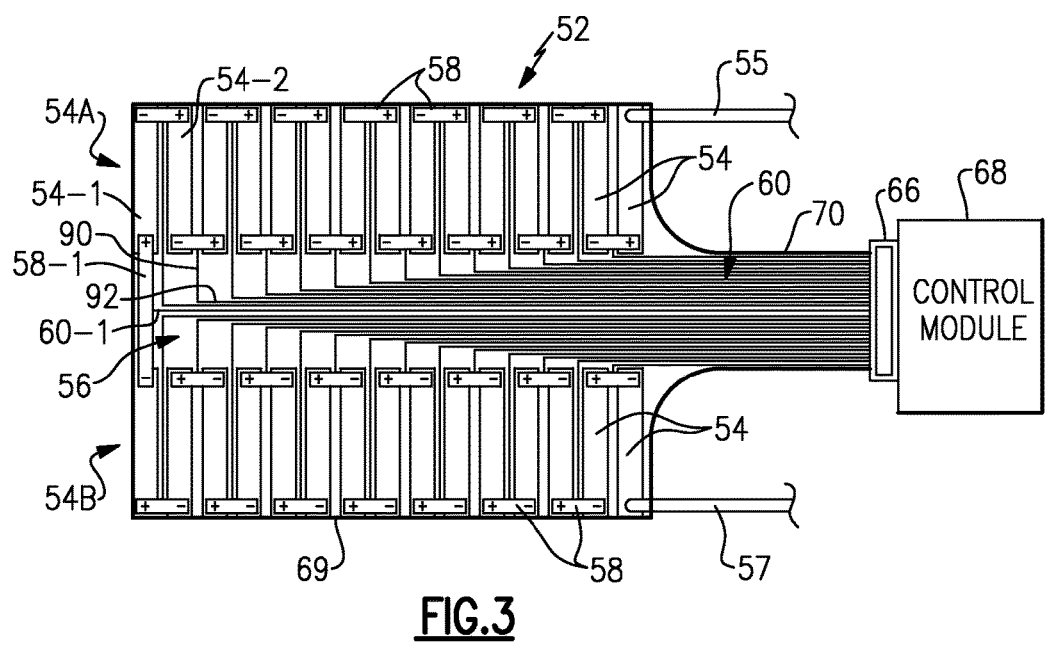
FIG. 3 illustrates a flex circuit system including a plurality of battery cells.

FIGS. 2 and 3 illustrate a flex circuit system 52 that can be incorporated into an electrified vehicle, such as the electrified vehicle 12 of FIG. 1. For example, the flex circuit system 52 may be incorporated into the battery assembly 50 to electrically connect a plurality of battery cells 54 (see FIG. 3) of the battery assembly 50. In one embodiment, the battery cells 54 are lithium-ion prismatic cells. However, other battery cells are also contemplated as within the scope of this disclosure.

In one non-limiting embodiment, the battery cells 54 are configured in a first row 54A and a second row 54B and are arranged in a series parallel string. Each battery cell 54 includes a positive terminal (designed by the symbol (+)) and a negative terminal (designated by the symbol (−)). Each battery cell 54 of the first row 54A and the second row 54B is arranged such that its terminals are opposite those of adjacent battery cells 54. For example, in one non-limiting illustration, the positive terminal (+) of a first battery cell 54-1 is positioned adjacent to a negative terminal (−) of a second battery cell 54-2 and the negative terminal (−) of the first battery cell 54-1 is positioned adjacent to the positive terminal (+) of the second battery cell 54-2. Although a specific number and arrangement of battery cells 54 is shown in FIG. 3, the battery assembly 50 could include any number of battery cells 54 configured in any manner within the scope of this disclosure.

The exemplary flex circuit system 52 may include at least a substrate 56, one or more bus bars 58, and one or more voltage sense leads 60. In the illustrated embodiment, the flex circuit system 52 includes a plurality of bus bars 58 and a plurality of voltage sense leads 60. However, this disclosure is not limited to the exact configuration shown. It should be understood that the flex circuit system 52 could include any configuration that includes one or more bus bars and voltage sense leads.

The flex circuit system 52 provides an integrated circuit for electrically connecting the battery cells 54 such that electrical power may be distributed efficiently and safely throughout an electrified vehicle. In use, high voltage current from each battery cell 54 is conducted through the bus bars 58. The first row 54A of battery cells 54 supplies electrical power to a negative voltage lead 55, and the second row 54B of battery cells 54 supplies electrical power to a positive voltage lead 57 (see FIG. 3). The first row 54A of battery cells 54 may be connected to the second row 54B of battery cells 54 by a bus bar 58-1. The voltage of each battery cell 54 may be measured by the voltage sense leads 60, which communicate voltage signals to a connector 66 that is connected between the substrate 56 and a control module 68 of the battery assembly 50, to avoid overcharging of the battery cells 54 and enable a current path for balancing the battery cells 54.

In one embodiment, the substrate 56 is made of a pliable (i.e., bendable) material. One non-limiting example of a pliable material suitable for fabricating the substrate 56 is Kapton®, which is available from DuPont. Other materials are also contemplated as within the scope of this disclosure, including but not limited to polyester (PET), polyimide (PI), polyethylene napthalate (PEN), polyethermide (PEI), and various fluropolymers (FEP) and copolymers.

The substrate 56 may include a body portion 69 and a tail 70 that extends from the body portion 69. The first row 54A and second row 54B of battery cells 54 and the bus bars 58 are each arranged relative to the body portion 69, while the voltage sense leads 60 extend between the bus bars 58 and the connector 66 along both the body portion 69 and the tail 70. In one embodiment, the substrate 56 embodies the shape of a rectangular paddle. However, the size and shape of the substrate 56 that is illustrated by FIGS. 2 and 3 is in no way intended to limit this disclosure.

In one embodiment, the bus bars 58 are stamped, relatively thin strips of metal that are configured to conduct power generated by the battery cells 54. Example bus bar 58 materials include copper, brass or aluminum, although other materials having conductive properties may also be suitable. In one embodiment, the bus bars 58 are high current bus bars having relatively high amperage capacities.

Figure 4:
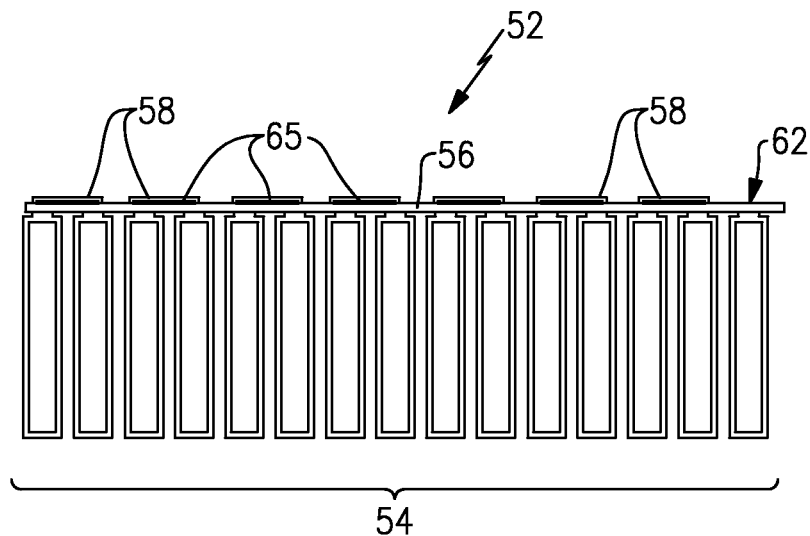
FIG. 4 illustrates section A-A of the flex circuit system of FIG. 2.

The bus bars 58 may be mounted to an exterior surface 62 of the substrate 56. In one embodiment, an adhesive 65 is used to mount the bus bars 58 to the substrate 56 (see FIG. 4). Any suitable adhesive may be used to connect the bus bars 58 to the substrate 56.

The bus bars 58 may be arranged and adhered to the substrate 56 using vision equipment. For example, automated pick and place equipment can be used to position the bus bars 58 on the substrate 56 and vision equipment can be used to verify correct X-Y-Z coordinate positioning. Similar methods can be used to place and align the substrate 56 onto the battery cells 54 during assembly, thus improving safety. The flexible substrate 56 offers a degree of flexibility in the Z coordinate direction which aids in the assembly of the bus bars 58 between adjacent cells, such as during welding procedures.

The adhesive 65 holds the bus bars 58 to the substrate 56, while the vision equipment can be used to accurately align the bus bars 58 during placement. Optionally, a locating feature 75 (see FIG. 6) can be used in combination with the vision equipment to achieve accurate positioning of the bus bars 58. The adhesive 65 and vision equipment enables a highly automated assembly of the flex circuit system 52, thereby increasing worker safety.

Each voltage sense lead 60 may be integrated with the substrate 56. Integrating voltage sense leads 60 with the substrate 56 may eliminate the need for wire based circuit designs. In this disclosure, the term "integrated with" means the voltage sense leads 60 are fabricated directly on or into the flex circuit system 52. In one embodiment, the voltage sense leads 60 include copper traces that are printed onto the exterior surface 62 of the substrate 56. The voltage sense leads 60 may be applied to the substrate 56 using a variety of additive or subtractive techniques. Non-limiting examples of such techniques include printing, plating, etching, laminating, engraving, milling, ablation, etc.

Figure 5:
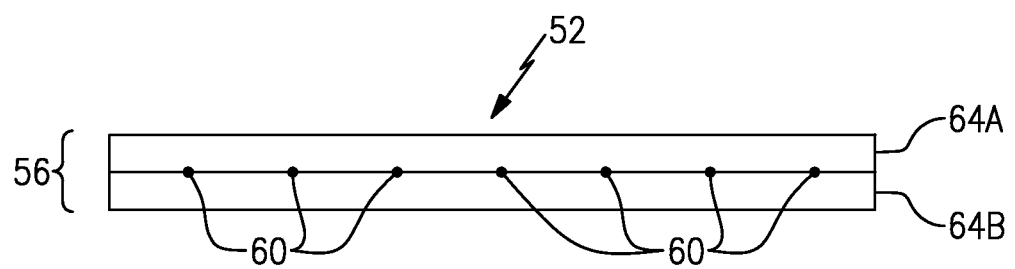
FIG. 5 illustrates a portion of a substrate of a flex circuit system.

In another embodiment, illustrated by FIG. 5, the voltage sense leads 60 are sandwiched between a first dielectric layer 64A and a second dielectric layer 64B of the substrate 56. The first dielectric layer 64A and the second dielectric layer 64B may be sealed together to prevent moisture from wicking into the voltage sense leads 60. Of course, this view is highly schematic and the substrate 56 could include additional layers.

Referring again to FIGS. 2 and 3, at least one voltage sense lead 60 extends between each bus bar 58 and the connector 66. The connector 66 may be attached to the tail 70 of the substrate 56 and connect to the control module 68. In one embodiment, the control module 68 is programed to measure a voltage communicated by each voltage sense lead 60 in order to prevent overcharging of the battery cells 54 as well as draining low level current through the voltage sense leads 60 in order to accomplish cell balancing. The control module 68 could additionally be programmed to perform multiple other functions related to the battery assembly 50 and the flex circuit system 52.

In one configuration, each voltage sense lead 60 includes at least a first trace 90 that extends in a first direction along the substrate 56 and a second trace 92 that extends in a second, different direction along the substrate 56. For example, the first traces 90 may vertically extend from the bus bars 58 toward a middle of the body portion 69 of the substrate 56, and the second traces 92 may horizontally extend across portions of the body portion 69 and the tail 70 of the substrate before terminating at the connector 66. In one embodiment, the voltage sense lead 60-1 that extends between the bus bar 58-1 and the connector 66 excludes any first trace 90.

The voltage sense leads 60 may be arranged to achieve a linear voltage potential increase in a direction that extends from the first row 54A of the battery cells 54 toward the second row 54B of the battery cells 54. This or similar arrangements can help maintain the integrity of the flex circuit system 52 by providing a low voltage gradient between adjacent voltage sense leads 60 that minimizes electric field density and the potential for dendrite growth. In one non-limiting embodiment, due to their configuration relative to one another, each voltage sense lead 60 is required to carry less than 100 milli-amps of current to the connector 66.

Figure 6:
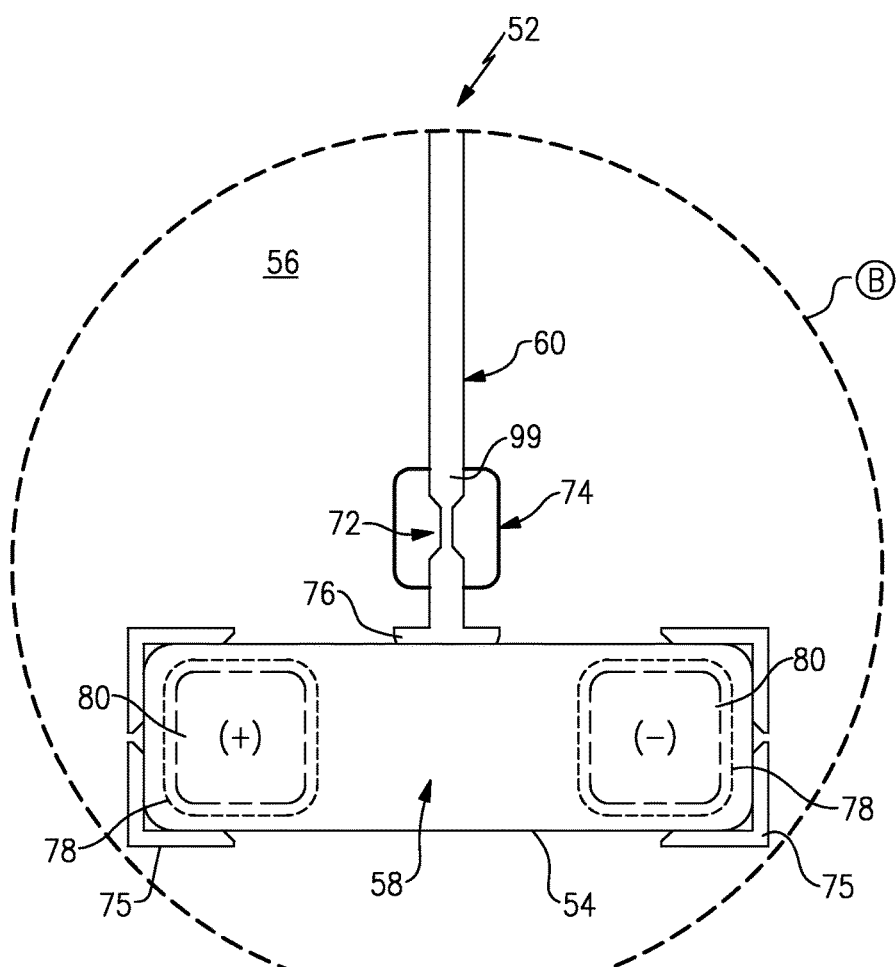
FIG. 6 illustrates a blown-up view of section B of FIG. 2.

FIG. 6 illustrates the interconnection of a single battery cell 54, bus bar 58, and voltage sense lead 60 of a flex circuit system 52. Relief areas 78 (shown in dashed lines) may be formed through the substrate 56 in order to receive terminals 80 of the battery cell 54. In one embodiment, the relief areas 78 are holes formed in the substrate 56 so that the terminals 80 may contact the bus bar 58. Connection of the terminals 80 to the bus bar 58 can be achieved via welding or any other suitable connection technique. As stated above, one or more locating features 75 may be utilized in order to optically align and position the bus bar 58 relative to the battery cell 54 prior to connecting the terminals 80 to the bus bar 58.

The voltage sense lead 60 may electrically connect to the bus bar 58 at an electrical connection 76. In one embodiment, the electrical connection 76 is achieved by soldering. In another embodiment, the electrical connection 76 is achieved by welding. One non-limiting welding technique includes sonically welding the voltage sense lead 60 to the bus bar 58. Any additional battery cells 54, bus bars 58 and voltage sense leads 60 of the flex circuit system 52 may be similarly connected.

One or more fuse links 72 may additionally be incorporated as a circuit protection component of the exemplary flex circuit system 52. In one embodiment, the fuse link 72 is integrated as part of the voltage sense lead 60 and is positioned near the bus bar 58. The fuse link 72 may be formed by narrowing a portion of a copper trace 99 of the voltage sense lead 60. In the event of a relatively high current event, the voltage sense lead 60 may sever at the fuse link 72 to break the circuit and avoid over-current and damaging the battery cell 54.

An opening 74 may be formed through the substrate 56 in order to view and/or access the fuse link 72. For example, the opening 74 may provide a way to visually confirm whether or not the circuit has been broken.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should additionally be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A flex circuit system, comprising:
   a substrate;
   at least one bus bar mounted to said substrate;
   at least one voltage sense lead integrated with said substrate;
   an adhesive disposed between said at least one bus bar and said substrate; and
   a fuse link formed in said at least one voltage sense lead, wherein said fuse link is a narrowed portion of said at least one voltage sense lead.

2. The system as recited in claim 1, wherein said substrate is made of a pliable material.

3. The system as recited in claim 2, wherein said pliable material includes a polyimide.

4. The system as recited in claim 1, wherein said at least one voltage sense lead is printed onto an outer surface of said substrate.

5. The system as recited in claim 1, wherein said at least one voltage sense lead is sandwiched between at least two dielectric layers of said substrate.

6. The system as recited in claim 1, wherein said at least one voltage sense lead extends between said bus bar and a connector that is configured to connect to a control module.

7. The system as recited as recited in claim 1, comprising an opening through said substrate configured to access said fuse link.

8. The system as recited in claim 1, wherein said fuse link is configured to sever in response to a high current event.

9. The system as recited in claim 1, wherein said substrate includes a body portion and a tail that extends from said body portion, said tail being narrower than said body portion.

10. The system as recited in claim 1, wherein said substrate is made of Kapton.

11. The system as recited in claim 1, comprising a locating feature mountable to said substrate and configured to align said at least one bus bar relative to said substrate.

12. The system as recited in claim 1, wherein said flex circuit system electrically connects a first row of battery cells and a second row of battery cells.

13. The system as recited in claim 12, wherein said first row of battery cells is connected to a negative voltage lead and said second row of battery cells is connected to a positive voltage lead.

14. The system as recited in claim 12, wherein said first row of battery cells and said second row of battery cells are positioned beneath a body portion of said substrate, and a tail of said substrate extends from said body portion to a location remote from said first row of battery cells and said second row of battery cells.

15. The system as recited in claim 1, wherein said substrate is paddle shaped.

16. The system as recited in claim 1, wherein said at least one voltage sense lead is connected to said at least one bus bar by a soldered or welded connection.

17. The system as recited in claim 16, comprising a copper trace extending between said soldered or welded connection and said fuse link.

18. The system as recited in claim 17, wherein said soldered or welded connection includes a first width that is greater than a second width of said copper trace, and said second width of said copper trace is greater than a third width of said fuse link.

19. A flex circuit system, comprising:
a substrate including a body portion and a tail;
a bus bar mounted to said body portion;
a voltage sense lead integrated with said substrate;
an adhesive directly between said bus bar and said body portion;
a fuse link formed in said voltage sense lead;
an opening formed in said substrate for accessing said fuse link;
a connector connected to said tail; and
a control module connected to said connector.

* * * * *